United States Patent [19]
Chang

[11] Patent Number: 5,954,831
[45] Date of Patent: Sep. 21, 1999

[54] METHOD FOR TESTING A MEMORY DEVICE

[75] Inventor: Edward C. M. Chang, San Francisco, Calif.

[73] Assignee: ECTS Inc., San Jose, Calif.

[21] Appl. No.: 08/947,264

[22] Filed: Oct. 8, 1997

[51] Int. Cl.$^6$ .................................................. G11C 29/00
[52] U.S. Cl. ................................... 714/720; 365/201
[58] Field of Search .................................... 714/720, 718, 714/722, 701, 42, 54; 365/200, 201; 364/265.3

[56] References Cited

U.S. PATENT DOCUMENTS

| | | | |
|---|---|---|---|
| H1741 | 7/1998 | Cruts | 714/720 |
| 4,335,457 | 6/1982 | Early | 714/720 |
| 5,661,730 | 8/1997 | Mitra et al. | 714/720 |

*Primary Examiner*—Trinh L. Tu

[57] ABSTRACT

A memory testing method for providing test patterns for a memory device is provided. First, the memory is divided into a plurality of blocks and a test pattern is applied to completely test a first block. Next, the first block is filled with all '1', and other blocks are filled with all '0'. Then, the first block is walked through the entire memory device to quickly test the memory and the function of the address decoder. The invention provides an efficient method for quickly and completely testing the semiconductor memory as well as detecting and locating all the address decoder faults. A method for selecting an optimal number for dividing a memory device into blocks is also presented to minimize the required test time.

6 Claims, 14 Drawing Sheets

FIG. 1

FIG.2 for N = 1024 it con be expressed as $M = 2^{10}$ where 10 is the number of address bits i.e. $A_0 - A_9$

METHOD FOR TESTING A MEMORY DEVICE

BACKGROUND OF THE INVENTION

1. Field of the Invention

The present invention relates generally to memory devices and more particularly to the testing of memory devices.

1. Prior Art Description

Semiconductor memories have made significant progress in recent years. Their density, i.e. the number of bits per chip and also the number of bits per area of silicon, is ever increasing. Since the early 70s, the storage size of a memory chip has been increasing from 1024 bits to 64M bits today. 128M bits memory has also been demonstrated will be widely available very soon.

Testing these memories has become a major concern because the test time is getting longer for testing current mega- and multimega-bit memory chips. Although the subject of memory testing has been covered extensively, and a variety of test algorithms have been presented, there is no major breakthrough in improving the test time for the past 20 years. The traditional test patterns that are used for testing memory devices are listed in Table 1.

For each of all the above traditional tests, the orders of the required total test time for the memory are also summarized in the Table 1 assuming read and write cycle times of 10 ns ($10^{-9}$ seconds) and a total number of N bits in the memory.

TABLE 1

Total Test Time Comparison of Different Memory Test Algorithms

| Algorithm | Order of total test time |
| --- | --- |
| Zero-One | O(N) |
| Checkerboord | O(N) |
| Walking One/Zero | O($N^2$) |
| Diagonal | O(N$\sqrt{N}$) |
| Marching Column | O(N$\sqrt{N}$) |
| Marching Row | O(N$\sqrt{N}$) |
| Complement of All Above | Same as all above |

Figure 1:
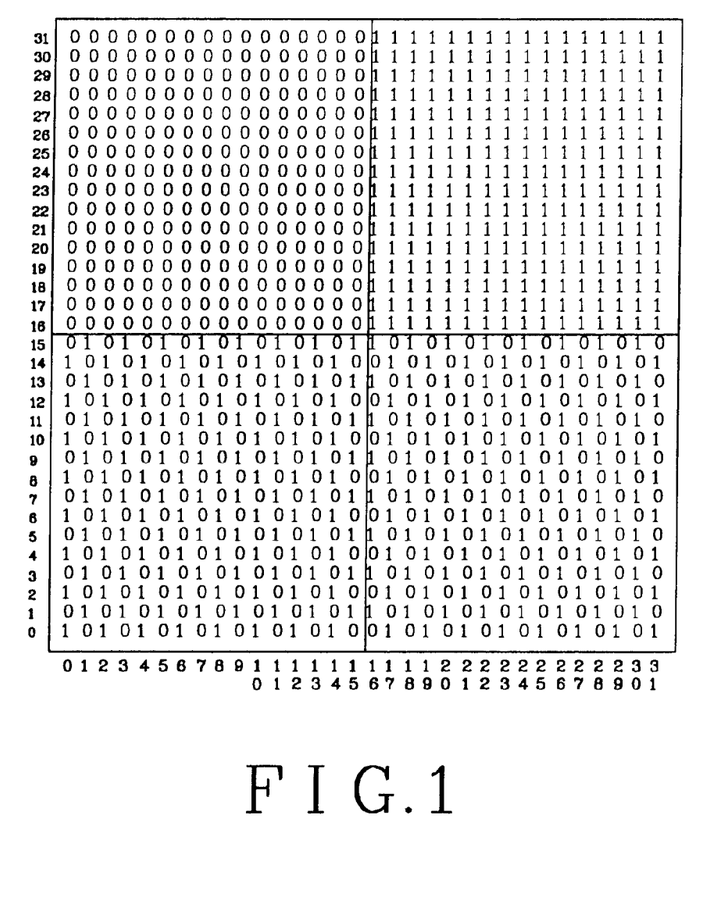
FIG. 1 shows four N type patterns of traditional memory testing algorithm.
Figure 2:
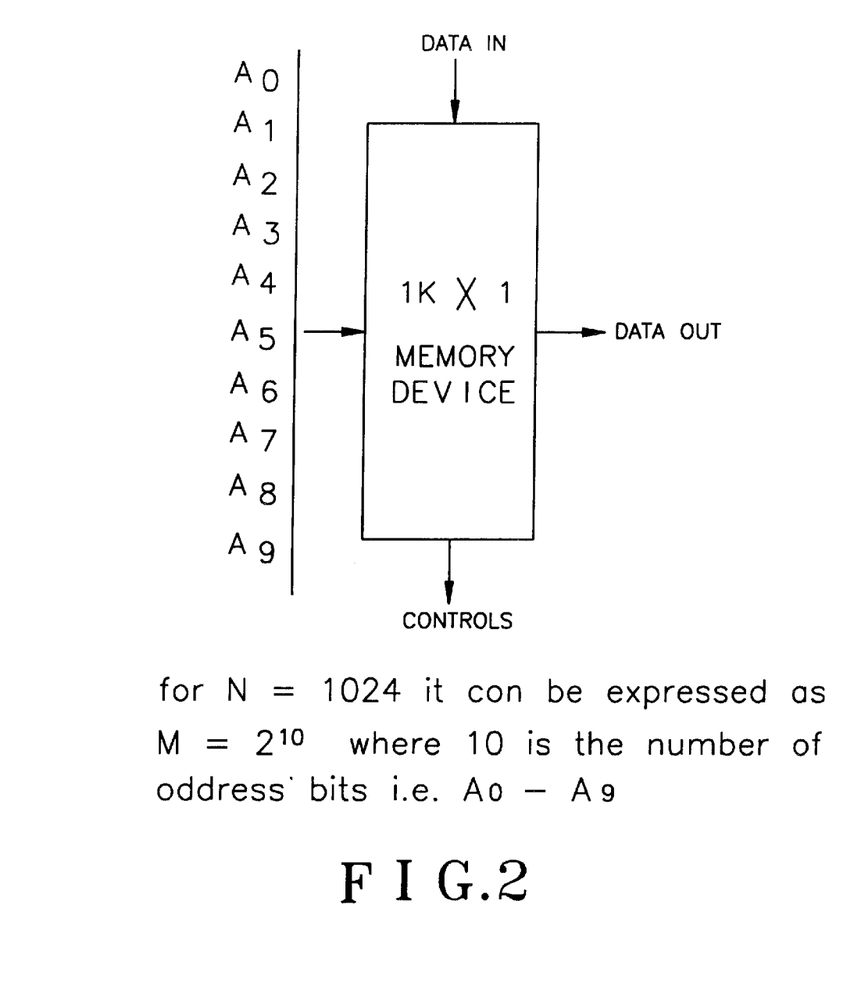
FIG.2 shows a 1024 bit memory device having 10 address bits.
Figure 3A:
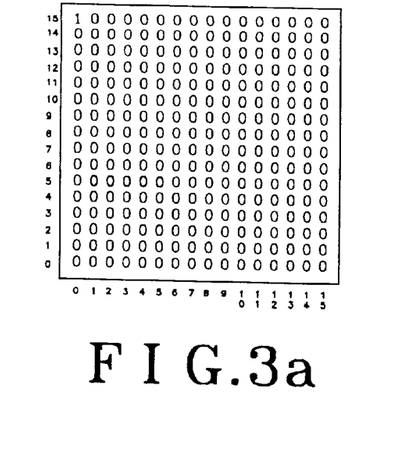
FIGS. 3a–3e show walking one/zero test patterns.
Figure 3B:
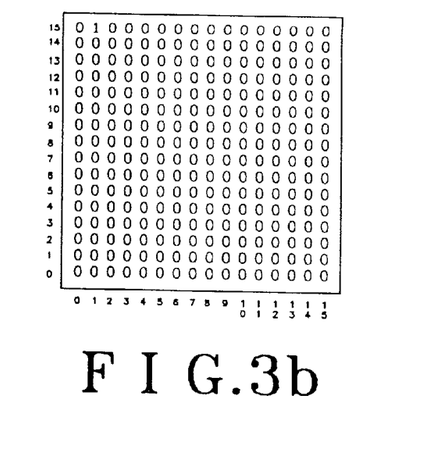
Figure 3C:
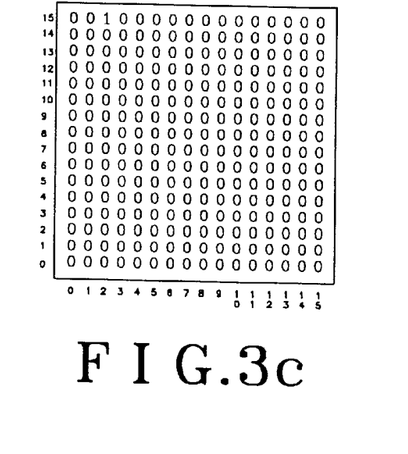
Figure 3D:
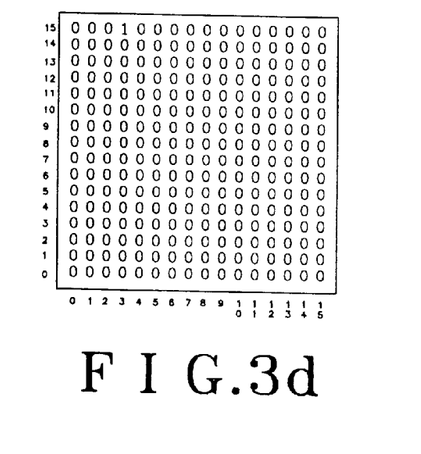
Figure 3E:
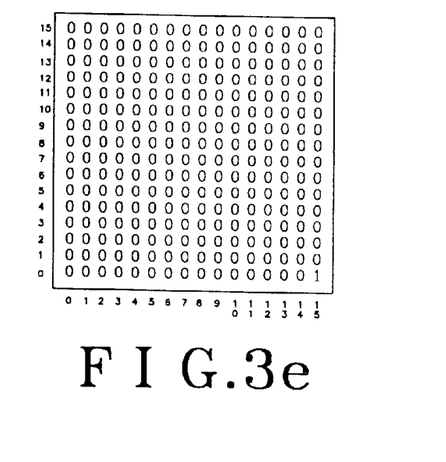
Figure 4A:
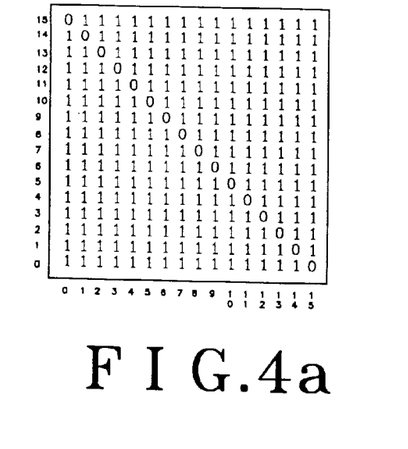
FIGS. 4a–4e show sliding diagonal test patterns.
Figure 4B:
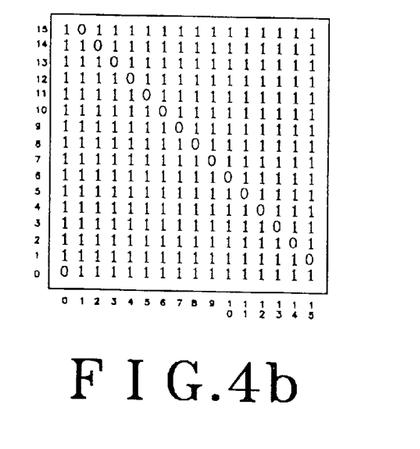
Figure 4C:
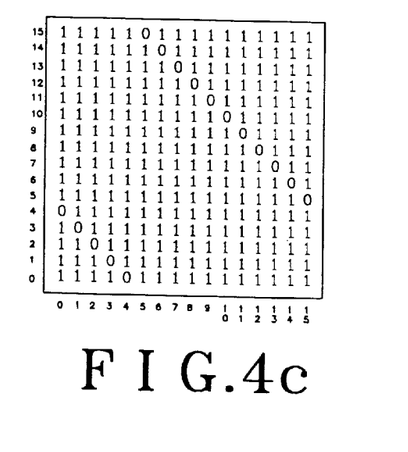
Figure 4D:
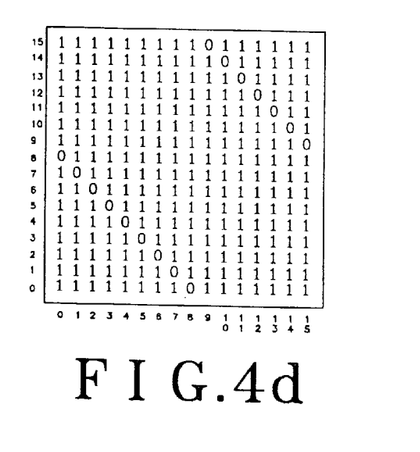
Figure 4E:
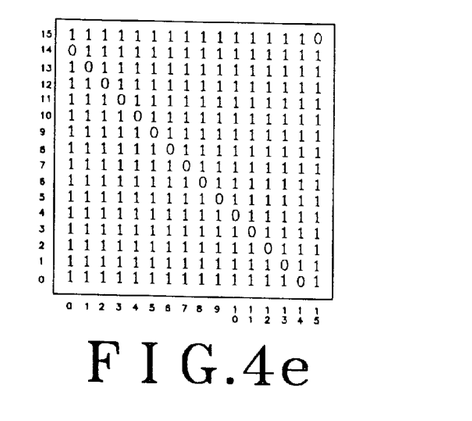
Figure 5A:
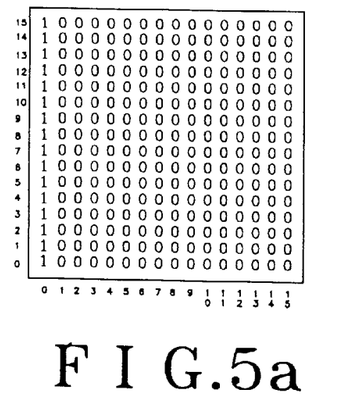
FIGS. 5a–5e show march column test patterns.
Figure 5B:
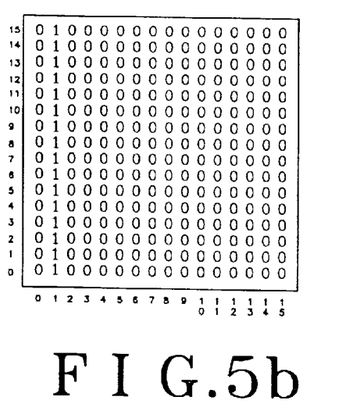
Figure 5C:
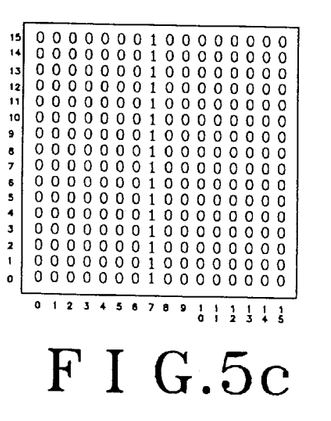
Figure 5D:
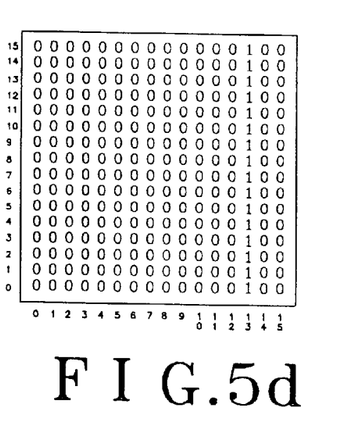
Figure 5E:
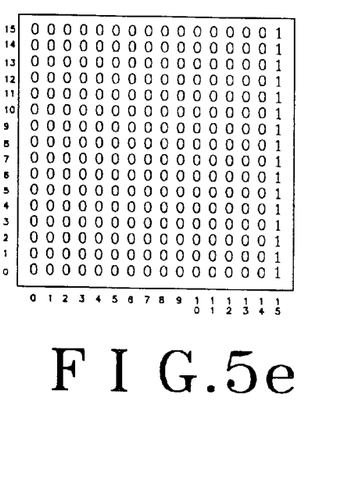
Figure 6A:
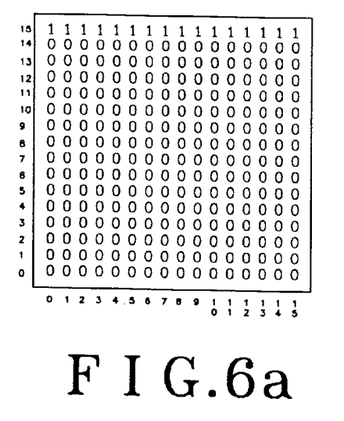
FIGS. 6a–6e show march row test patterns.
Figure 6B:
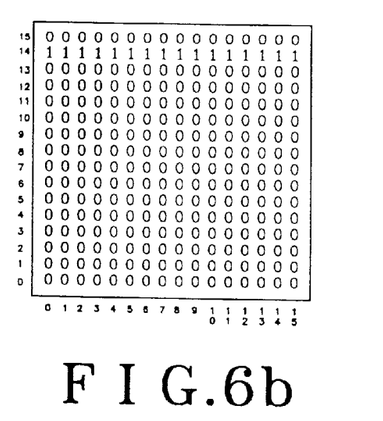
Figure 6C:
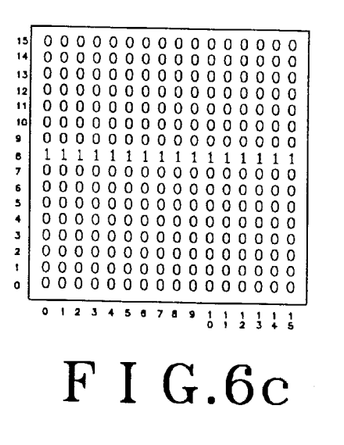
Figure 6D:
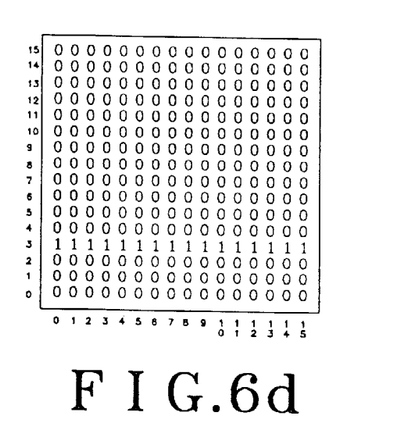
Figure 6E:
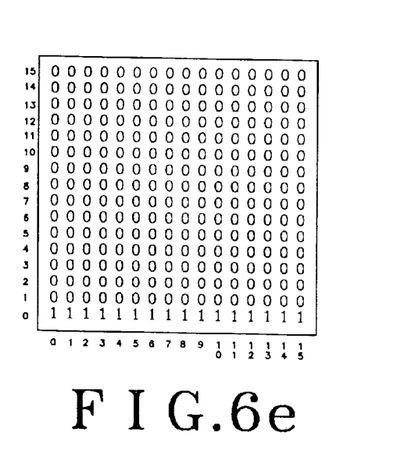

As we can see, the Zero-one test (minimal test) patterns and the Checkerboard test (short and simple test) patterns are N type patterns. The Walking One/Zero test patterns are $N^2$ patterns. And, the Diagonal test, the Marching Column test and the Marching Row test are N$\sqrt{N}$ patterns. FIG. 2 shows a 1024 bit memory device having a 10 bit memory address. In general, a memory device is presented as the total bit size N or by the number of address bits. For example, a 1024 bit memory can be represented by 10 address bits. Or N=$2^{10}$, or X=$2^5$ and Y=$2^5$. That is, N=X*Y=($2^5$)*($2^5$)=$2^{10}$. There are four N type test patterns shown in FIG. 1. They are all '0', all '2', checker board and checker board complement respectively.

There are two basic tests for a memory device. One is a memory cell test, the other is an address decoding test. The N type patterns are used for the memory cell test. More complicated patterns are used for address decoding test. The reason for using more complicated patterns for address decoding is that the N type patterns are repetitive patterns as shown in FIG. 1. A memory device passes an N type pattern test does not mean that its decoder functions correctly. For example, in all '0' or all '1' test, the entire memory cells are filled with '0' or '1'. When we scan the entire memory cells, the output is either '0' or '1' especially for memory devices with single input bit and single output bit as shown in FIG. 2. We don know whether or not the address decoder indeed addresses every memory cell correctly because the memory device has only one output pin, which is either a '1' or a '0'. There is not enough information to determine which memory cell is addressed by the decoder. Therefore, these tests are based on the assumption that the address decoder functions correctly, and more sophisticated patterns were developed to test and ensure the proper function of the decoder.

The first pattern that was developed to test the address decoder is the 'Walking' pattern as shown in FIG. 3. FIG. 3 shows walking a '1' through a fields of '0'. The complement of 'Walking One' pattern is a 'Walking Zero', which is walking a '0' through a field of '1'. As shown in FIG. 3a, the entire memory cells are filled with '0' except location 0. A '1' is written into location 0. Then memory read operations of the entire memory cells are performed. Only at location 0, a '1' is read and a '0' is read from each of all other locations. To prove the address decoder decodes location 0 correctly, it is required to read the memory cell N times. After having proven that location 0 decodes correctly, location 0 is changed to a '0' and location 1 is changed to a '1' as shown in FIG. 3b. Then read operations of the entire memory are performed. This time only location 1 should have a '1' and each of all other locations should have a '0'. To test 2 locations, it requires 2*N read operations. In order to test the decoder completely, a '1' has to walk from location 0 to location N. Therefore it requires N*N times. This kind of patterns are referred to as N square ($N^2$) patterns.

As the size of memory keeps on increasing, testing with $N^2$ patterns are too time consuming. In most cases, it would exceed 1 hour. In order to reduce the test time, the N$\sqrt{N}$ patterns were developed. FIGS. 4, 5 and 6 illustrate the N $\sqrt{N}$ patterns. FIG. 4 is a sliding diagonal pattern. FIG. 5 is a marching column pattern and FIG. 6 is a marching row pattern. Even with the N$\sqrt{N}$ patterns, the test time is longer than 1 hour for most of the large size memory devices.

Moreover, these traditional schemes have significant restrictions, such as Zero-One and Checkerboard tests have a very questionable fault coverage, and for correct application of checkerboard and sliding diagonal, the exact location of each memory cell must be known. That means that if the address lines are scrambled within the chip, which is often the case, the scramble table must be known in order to be able to perform the tests.

As summarized above, to test memory using conventional tests (such as Zero-One test and checkerboard test), it is necessary that the address decoder functions correctly. And, to test address decoder, even with the N$\sqrt{N}$ pattern test (such as the marching column test, the marching row test and the sliding diagonal test), it is time-consuming for most of the large size memory. In addition, it may require that the memory technology be known (i.e. whether the memory device returns an AND function or an OR function when multiple cells are read).

SUMMARY OF THE INVENTION

This invention has been made to overcome the aforementioned drawbacks of time-consuming and inability to detect address decoder function in the memory testing. It is a primary object of the present invention to provide a method for testing a memory device.

During the first phase of the test algorithm of the present invention, the memory is properly partitioned into a plurality of blocks. An N√N pattern is employed for testing a partitioned block. This would test and ensure that the address decoder within the block is correct. Next, the whole block is filled with all '1' and the back ground filled with all '0'. Then, the present invention achieves the new memory testing process by simply walking the block through the entire memory device for testing the remaining address decoder. Hence, all the faults of the address decoder are thus detected and located, and it is also much more efficient for completely testing the memory than the conventional memory testing processes.

According to the present invention, the optimal value m of the number of partitioned blocks in the memory testing is also disclosed. With this value, the memory is partitioned into proper number of blocks and the minimal required test time is thus obtained.

Further objects and advantages of the present invention will become apparent from a careful reading of a detailed description provided herein below, with appropriate reference to accompanying drawings.

DETAILED DESCRIPTION OF THE PREFERRED EMBODIMENT

Figure 7:
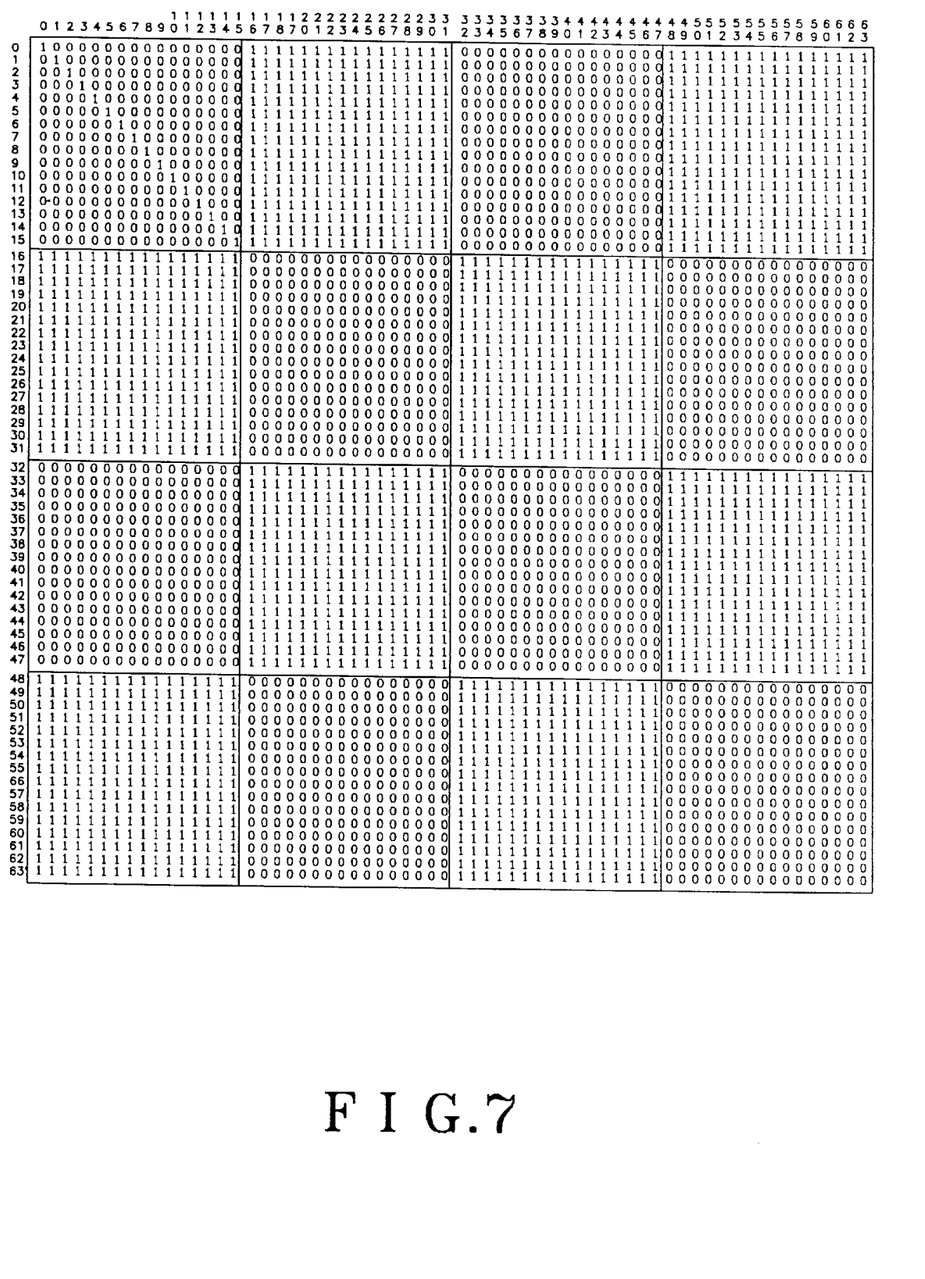
FIG. 7 illustrates a memory device which is partitioned into many blocks in accordance with the present invention.
Figure 8:
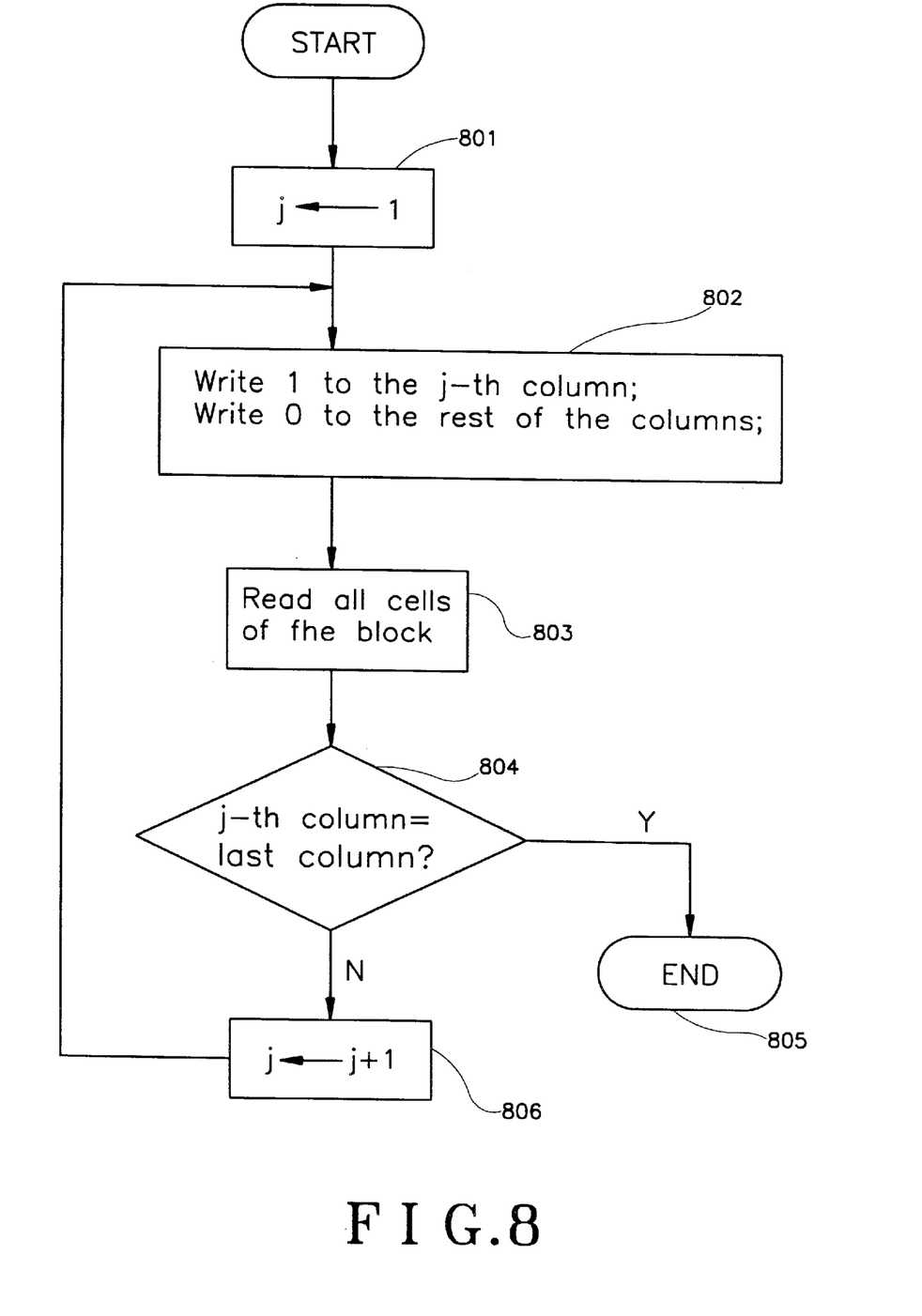
FIG.8 is a flowchart showing the steps of generating march column test patterns (an embodiment of N√N type pattern) for a partitioned block of a memory according to the first phase of the test algorithm of the present invention.
Figure 9:
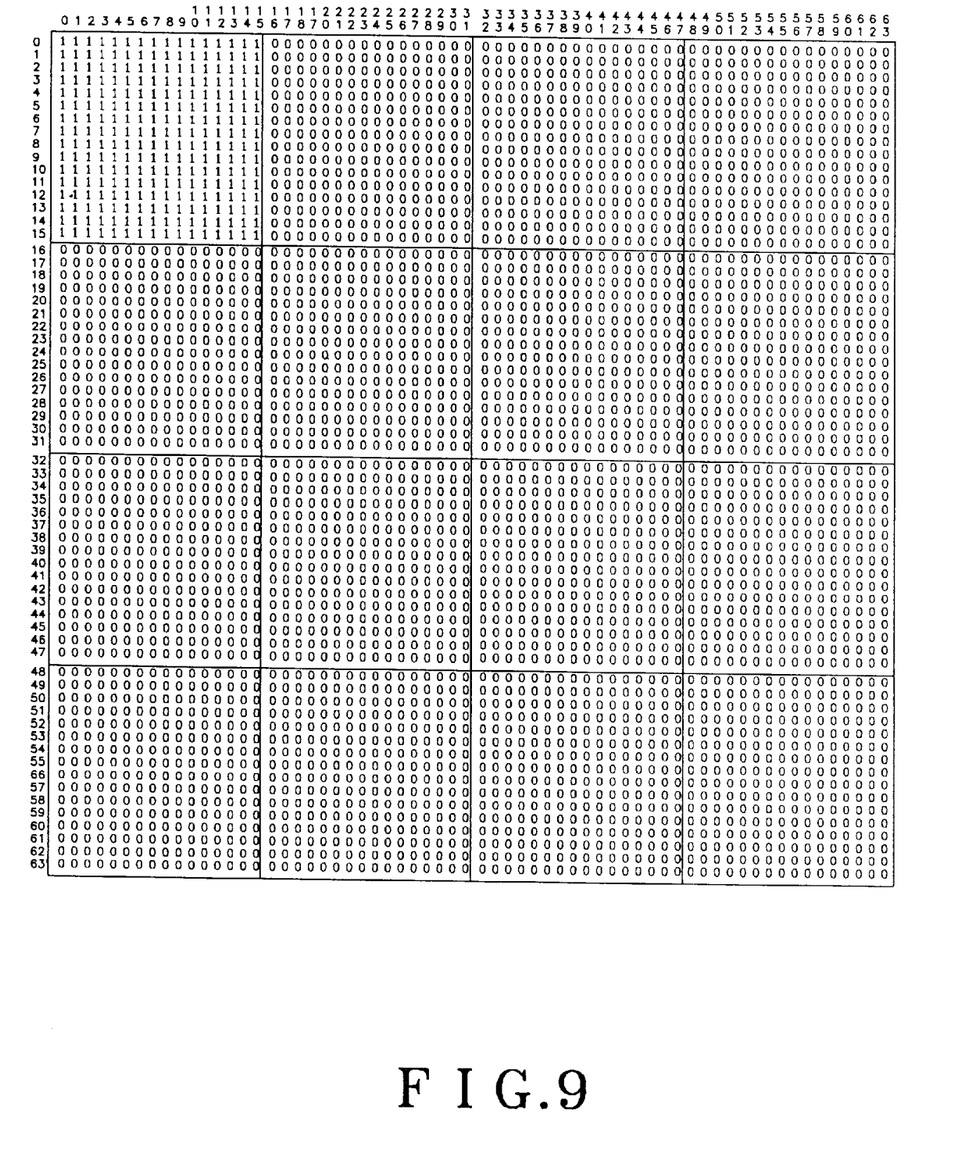
FIG.9 shows a whole block which is filled with all '1' and the back ground filled with all '0' in accordance with the second phase of the test algorithm of the present invention.
Figure 10:
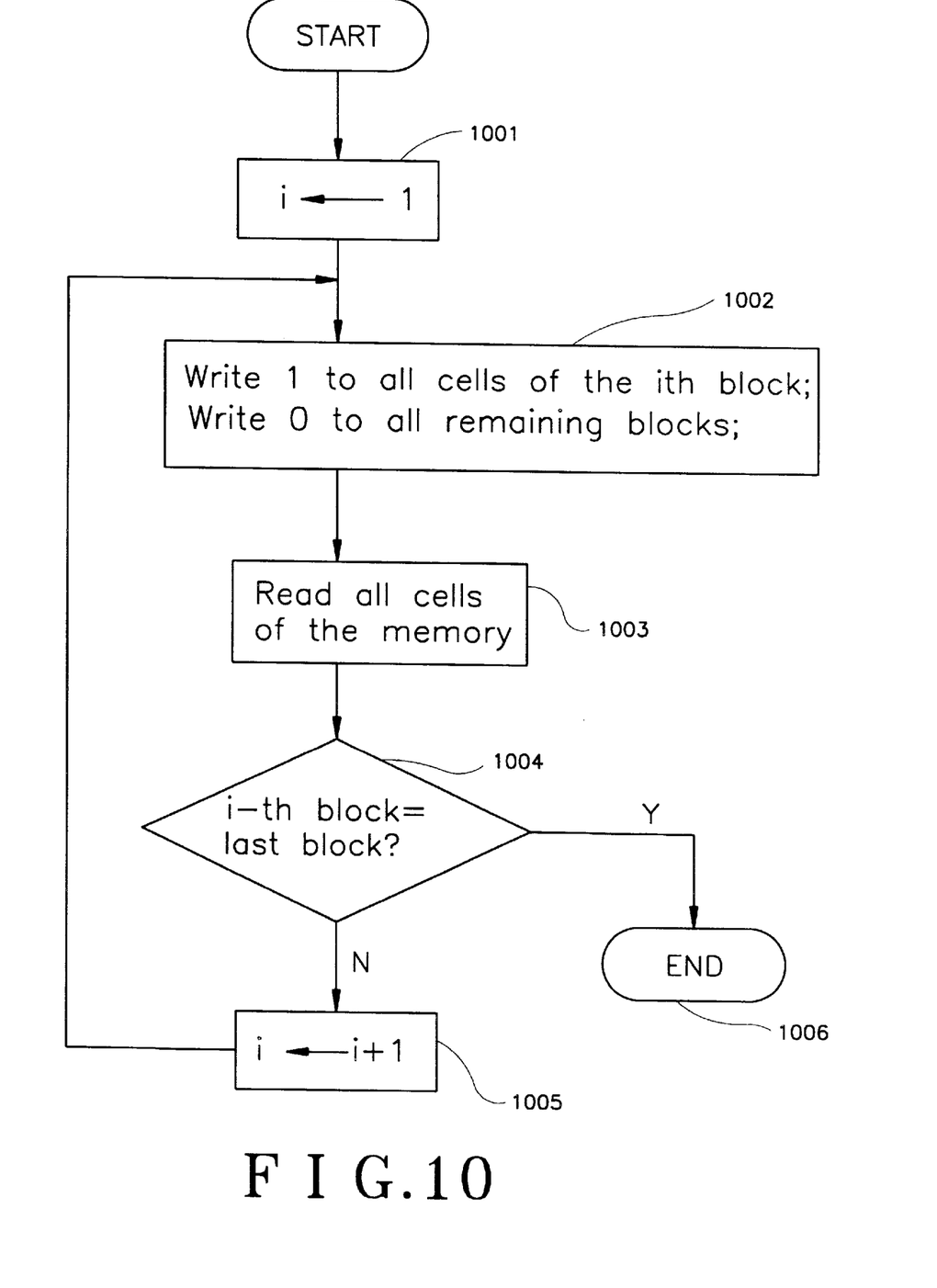
FIG. 10 is a flowchart showing the steps of testing the remaining address decoder by walking the block of FIG.9 through the entire memory device.
Figure 11:
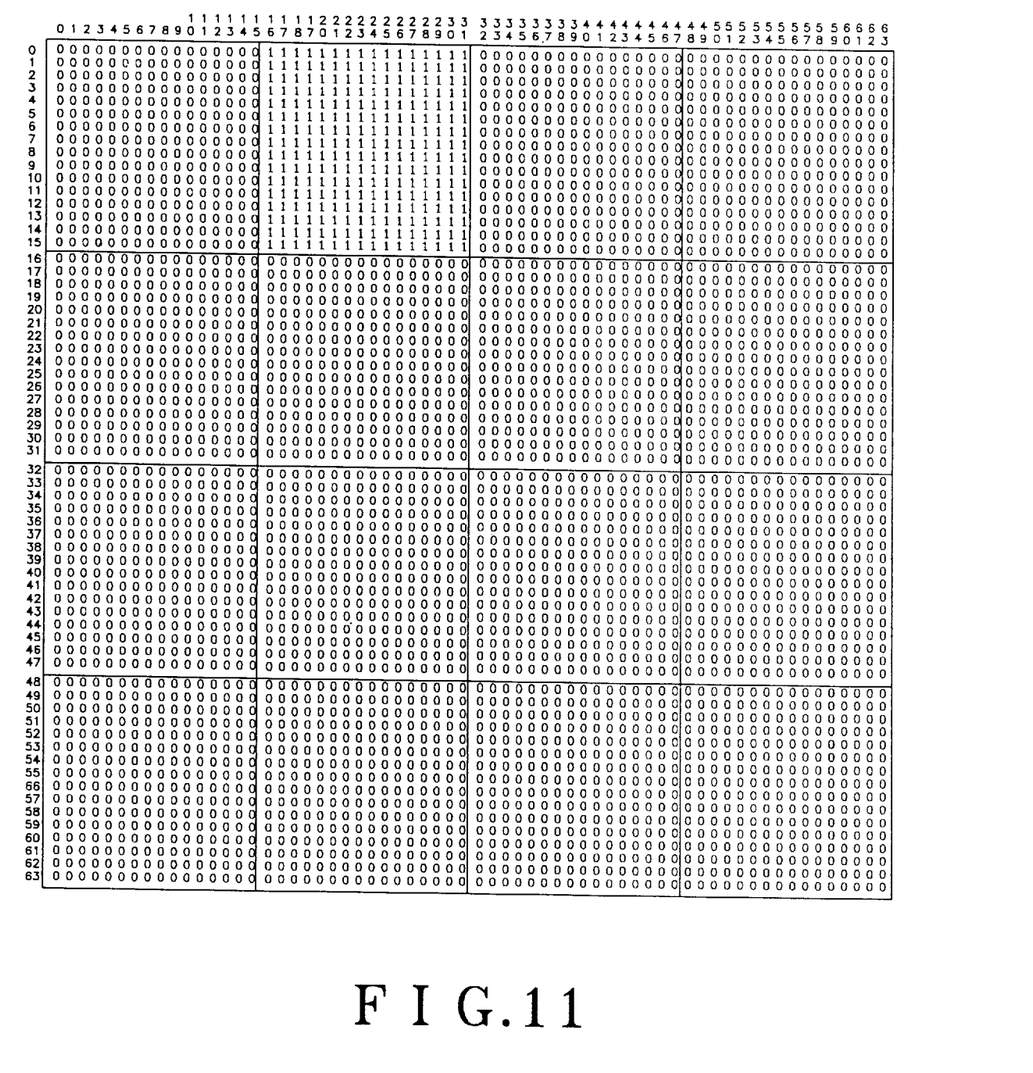
FIG. 11–FIG. 13 show the test patterns for testing the remaining address decoder by walking the block of FIG. 9 through the entire memory device.
Figure 12:
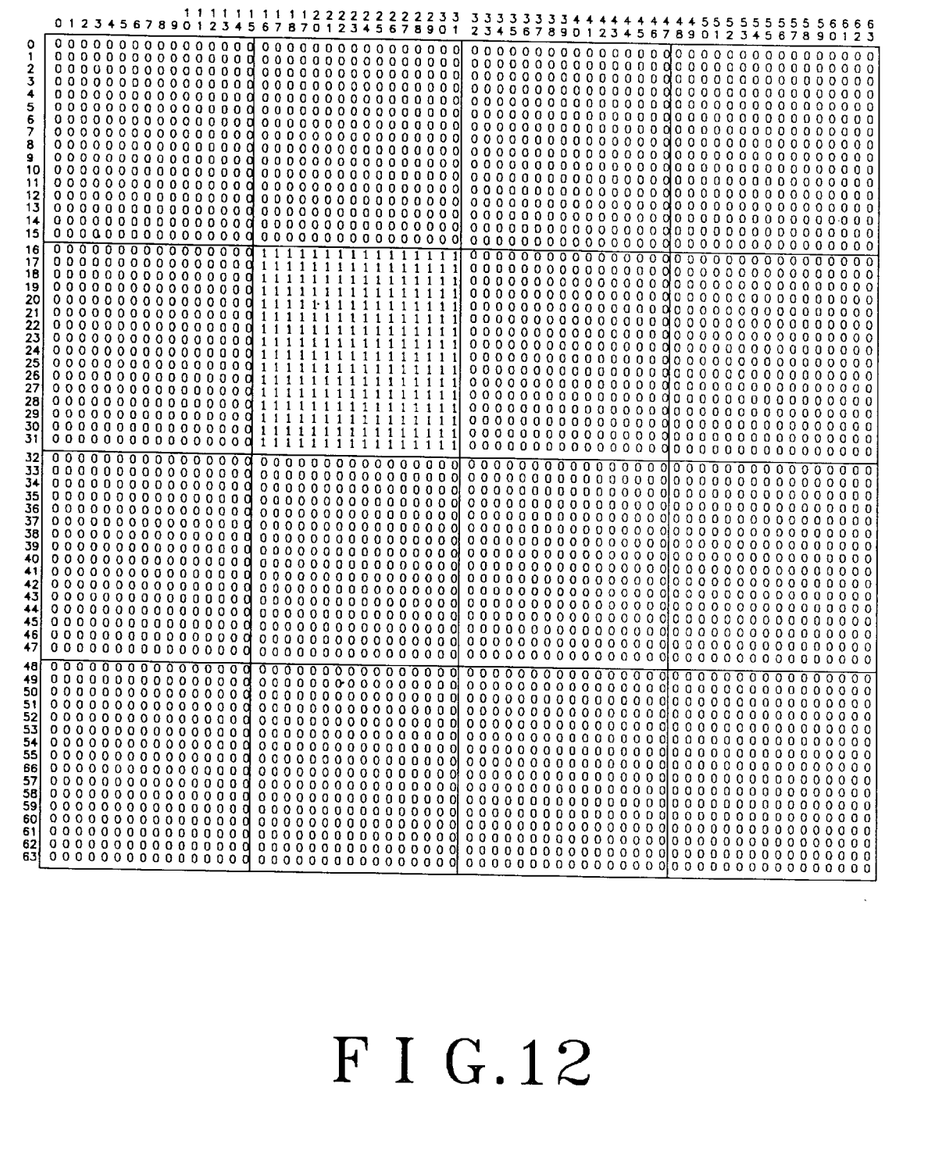
Figure 13:
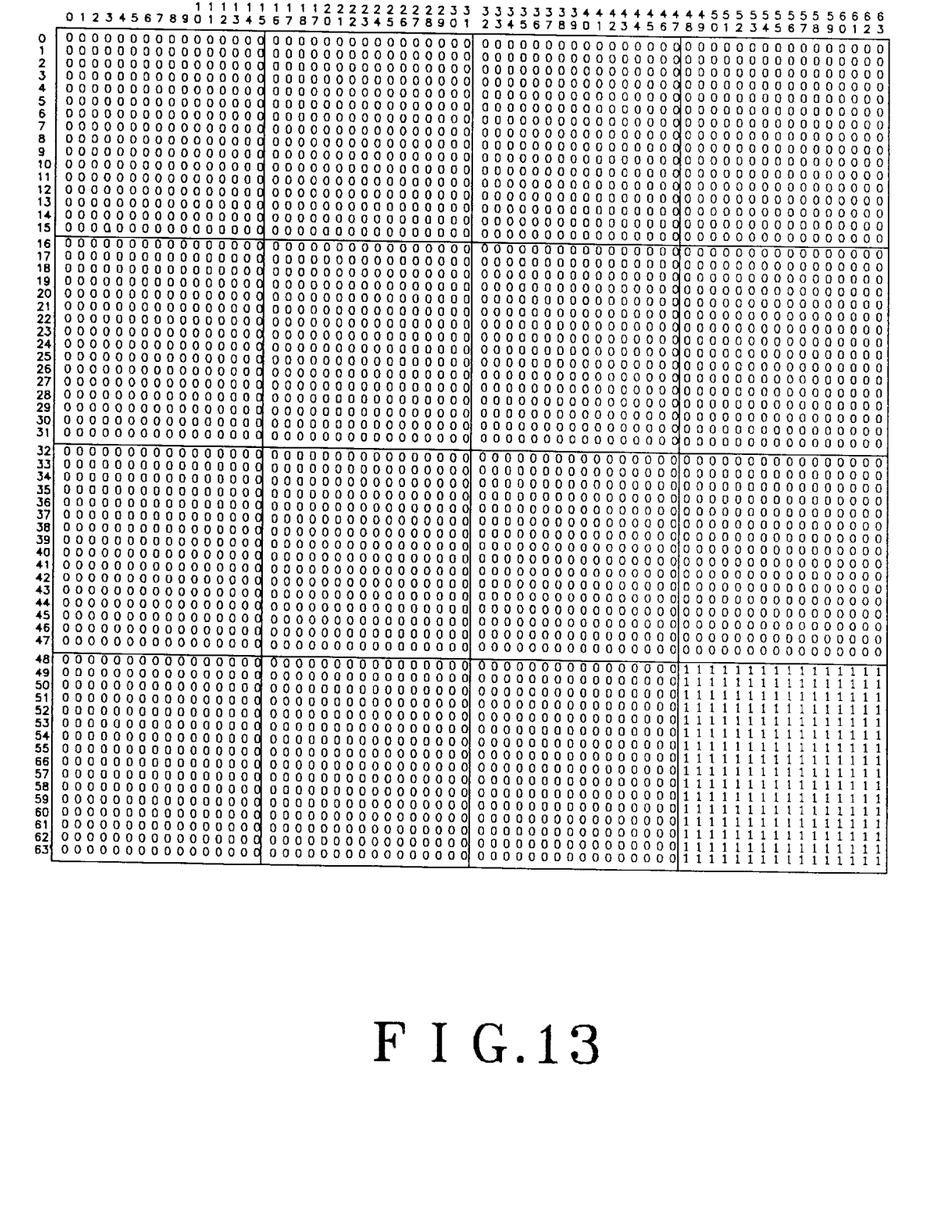

Assume N is the total number of bits (cells) in a memory device, and m is the number of partitioned blocks in the memory. An embodiment of the test pattern generating method of this invention for the memory testing will be explained in the following with reference to the drawings. For best illustration, we divide this description into Part A, Part B and Part C as follows.
Part A First, the present invention is to divide the memory device into many blocks as shown in FIG.7 (The optimal value of number of blocks m will be disclosed in Part C.). Then, an N√N type pattern is used for testing in a block. Referring to the drawings, FIG.8 illustrates the flowchart showing the steps of generating march column test patterns (an embodiment of N√N type pattern) for a partitioned block of the memory in accordance with the present invention. As shown in the figure, a column index j of the block is set to be 1 at the beginning of the step 801. Then, the rest of the block is filled with '0' at step 802. Therefore, the j-th column is filled with all '1', and the rest columns of the block are filled with all '0'. A read operation of the entire block cells is performed (step 803), i.e., read all cells of the block. In accordance with the march column test, the base-column which is filled with 1s walks through all columns in the block. Therefore, after having checked whether the j-th column equals the last column of the block (step 804), we increase the column index j by one (step 805) and return to step 802 if it has not reached the last column yet. Otherwise, the base-column has walked through the entire block and this block testing has been done (step 806). During this phase, since an N√N type pattern is employed, it requires $(N/m)(\sqrt{N/m})$ read operations to test this block. FIGS. 5a–5e show march column test patterns. As shown in FIGS. 5a–5e, at the k-th iteration, only the k-th column in the block contains '1', the rest columns of the block are filled with '0'.
Part B Next, the whole block is filled with all '1' and the back ground filled with all '0' as shown in FIG. 9. The present invention achieves the new memory testing process by simply walking the block through the entire memory device for testing the remaining address decoder. The detailed steps are illustrated by the flowchart of FIG. 10. In the following FIGS. 11, 12 and 13, we may see that each block containing '1' is surrounded by blocks containing '0'.

Referring to FIG. 10, a block index i of the memory is set to be equal to 1 at the beginning of the step 1001. Then, a simple test pattern is written into the memory at the following step 1002. The i-th block is filled with all '1', and the rest blocks are filled with all '0'. Then a read operation of the entire memory cells is performed (step 1003), i.e. read all cells of the memory. In accordance with the present invention, the base-block which is filled with '1' walks through the entire memory device. Therefore, after having checked whether the i-th block equals the last block of the memory (step 1004), we increase the block index i by one (step 1005) and return to step 1002 if it has not reached the last block yet. Otherwise, the base-block has walked through the entire memory device and this memory testing has been done (step 1006). During this phase, it requires mN read operations to test the remaining address decoder because the block of FIG. 9 is shifted m times.

Figure 14:
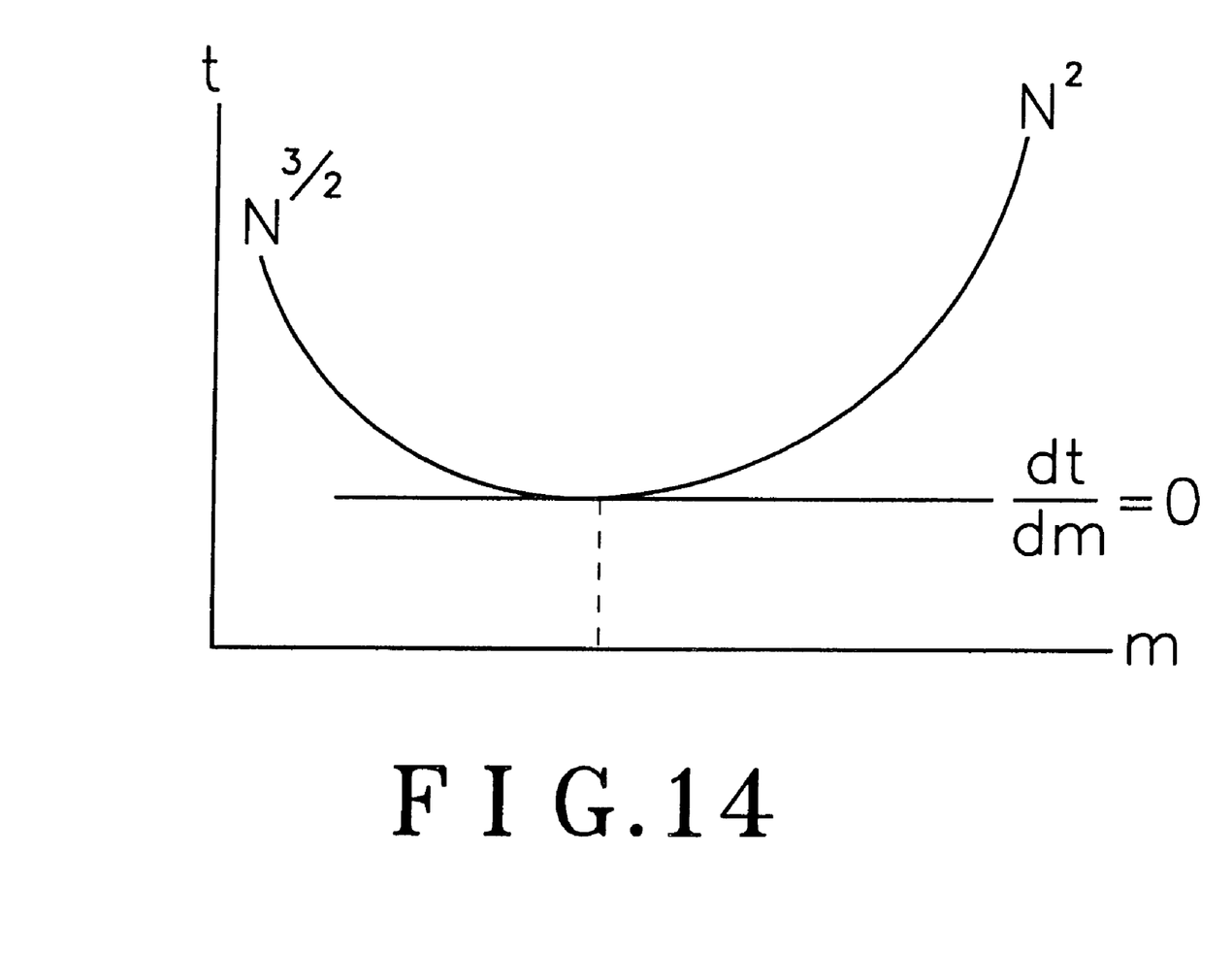
FIG. 14 is a graph for explaining the required number of operations in a memory testing at different numbers of partitioned blocks according to the present invention.

Combining Part A and Part B of the present invention, we may see that the total required test time t can be expressed as $t=(N/m)(\sqrt{N/m})+Nm$ time units. By examining the equation, if m=1 (i.e. the memory is not partitioned.), then the test time would be $N^{3/2}$ time units. If m=N (i.e. each block of the memory contains only one bit.), then the test time would be $N^2$ time units. FIG. 14 shows the total number of operations $(N/m)(\sqrt{N/m})+mN$ in a memory testing at different numbers of partitioned blocks m in accordance with the present invention.
Part C To determine the minimum test time against the block size, then the derivative derived by differentiating $(N/m)(\sqrt{N/m})+mN$ with respect to m must equal zero. Therefore, we have $(-3/2)[N^{3/2}][m^{-5/2}]+N=0$. This leads to $m=(9*N/4)^{1/5}$ and an approximation of m is $N^{1/5}$. We may express m and memory size N as powers of 2, i.e. $m=2^b$ and $N=2^a$, respectively. Then, the relation between a and b is that b should be the minimum integer such that b>=(a/5).

By using a 4M byte(i.e. $N=4*2^{20}=2^{22}$) memory device as an example, we examine and compare the test time of traditional $N^{3/2}$ type pattern and our new pattern as follows:
(1) For a traditional $N^{**(3/2)}$ type pattern, the test time is $N^{3/2}$, i.e., $2^{33}$ time units.
(2) By using our new pattern, then a equals 22 and b is the minimum integer such that b>=(22/5), i.e. 5. The test time is $(2^{22}/2^5)^{3/2}+(2^5)(2^{22})$, i.e., $2^{25.5}+2^{27}$ time units
(3) Comparing (2) with the traditional $N^{3/2}$ type pattern, the test time has been reduced to $\{2^{25.5}+2^{27}\}/2^{33}$, i.e., a reduction to leas than 1/50.

We thus see that the test time has been reduced by approximately 50 times in accordance with the present invention. We may reexamine the test time by using a variety of b values such as 4 (smaller than 5) and 6 (greater than 5). If b equals 4, then the test time is $(2^{22}/2^4)^{3/2}+(2^4)(2^{22})$, i.e., $2^{27}+2^{26}$ time units. If b equals 6, then the test time is $(2^{22}/2^6)^{3/2}+(2^6)(2^{22})$, i.e. $2^{24}+2^{28}$ time units. This proves that when b equals 5, the test time is at its minimum.

Below it will be proven that the scheme of the present invention detects all SAFs (stuck-at fault, that means the logic value of a stuck-at cell or line is always 0 or 1) in the memory cell array and in the read/write logic and all faults in the address decoder.

Memory cell array: For each cell, both data values 0 and 1 have been written and verified in accordance with the present invention. This assures that the read and write operations can be applied to each cell. It thus detects all SAFs in the memory cell array.

Read/write logic: SAFs in the read/write logic cause bit positions to be permanently stuck at some logic level. Since both data values 0 and 1 are written and read, it detects SAFs in the read/write logic.

Address decoder: An address decoder will result in the following four address decoder faults: (a) Fault 1. With a certain address, no cell will be accessed. (b) Fault 2. There is no address with which this cell can be accessed. A certain cell is never accessed. (c) Fault 3. With a certain address, multiple cells are accessed simultaneously. (d) Fault 4. A certain cell can be accessed with multiple address. Because there are many addresses, none of the above faults can stand alone. When fault 1 occurs, either fault 1 or fault 3 must also occur. With fault 2, at least fault 1 or fault 4 occur; with fault 3, at least fault 1 or 4, with fault 4, fault 2 or 3. Fault A re to the combination of fault 1 and fault 2. Fault B refers to the combination of fault 1 and fault 3. Fault C refers to the combination of fault 1 and fault 4. Fault D refers to the combination of fault 3 and fault 4. During the first and second phases, all Faults A, B, C and D are detected and located in accordance with the present invention because the requirements of two conditions (Condition 1: Read the value x from cell 0, then write the complement value of x to cell 0; read the value x from cell 1, then write the complement value of x to cell 1; . . . ; read the value x from cell n−1, then write the complement value of x to cell n−1. Condition 2: Read the complement value of x from cell n−1, then write the value of x to cell n−1; read the complement value of x from cell n−2, then write the value of x to cell n−2; . . . ; read the complement value of x from cell 0, then write the value of x to cell 0) are met, and the scheme of the present invention also assures that the read and write operations can be applied to each cell and that the cell is not stuck-at.

Moreover, the scheme of the present invention detects all AFs and SAFs without assuming that the technology is known. Comparing with the test memory using conventional tests, one can see that the scheme of the present invention takes only $(N/m)(\sqrt{N/m})+mN$ operations but has a much better fault coverage.

Although this invention has been described with a certain degree of particularity, it is to be understood that the present disclosure has been made by way of preferred embodiments only and that numerous changes in the detailed construction and combination and arrangement of parts may be restored to without departing from the spirit and scope of the invention as hereinafter set forth.

What is claimed is:

1. A method of testing a memory device having a plurality of bits arranged in rows and columns, said method comprising the steps of:
   a) dividing said plurality of bits into a plurality of blocks each having a number of bits;
   b) selecting a first block from said plurality of blocks;
   c) testing said first block using a test pattern;
   d) filling each bit of said first block with a value and filling each bit of other blocks with the complement of said value;
   e) testing said memory device by walking said first block through each of other blocks of said memory device.

2. The method of testing a memory device according to claim 1, wherein said value of the step (d) is 1.

3. The method of testing a memory device according to claim 1, wherein said value of the step (d) is 0.

4. The method of testing a memory device according to claim 1, wherein said memory device has N bits and said test pattern of the step (c) is an $N\sqrt{N}$ type pattern.

5. The method of testing a memory device according to claim 1, wherein said memory device has N bits and the step (a) further includes selecting an integer m approximating $N^{(1/5)}$ for dividing said memory device into m blocks.

6. The method of testing a memory device according to claim 1, wherein the number of said plurality of blocks of the step (a) is a power of 2.

* * * * *